US00RE46486E

(19) United States
(12) Reissued Patent
Niimura et al.

(10) Patent Number: US RE46,486 E
(45) Date of Reissued Patent: Jul. 25, 2017

(54) SEMICONDUCTOR PRESSURE SENSOR

(71) Applicants: Yuichi Niimura, Osaka (JP); Hideo Nishikawa, Osaka (JP); Fumihito Kato, Osaka (JP)

(72) Inventors: Yuichi Niimura, Osaka (JP); Hideo Nishikawa, Osaka (JP); Fumihito Kato, Osaka (JP)

(73) Assignee: Panasonic Corporation, Osaka (JP)

(21) Appl. No.: 14/820,698

(22) Filed: Aug. 7, 2015

Related U.S. Patent Documents

Reissue of:
(64) Patent No.: 8,809,975
Issued: Aug. 19, 2014
Appl. No.: 13/993,460
PCT Filed: Dec. 13, 2011
PCT No.: PCT/IB2011/003018
§ 371 (c)(1),
(2) Date: Jun. 12, 2013
PCT Pub. No.: WO2012/080811
PCT Pub. Date: Jun. 21, 2012

(30) Foreign Application Priority Data

Dec. 15, 2010 (JP) ..... 2010-279313
Dec. 15, 2010 (JP) ..... 2010-279314

(51) Int. Cl.
*H01L 41/113* (2006.01)
*B81B 3/00* (2006.01)
(Continued)

(52) U.S. Cl.
CPC ..... *B81B 3/0086* (2013.01); *G01L 9/00* (2013.01); *G01L 9/0054* (2013.01); *H01L 29/84* (2013.01)

(58) Field of Classification Search
CPC ..... B81B 3/0086; G01L 9/0054; G01L 9/00; H01L 29/84
(Continued)

(56) References Cited

U.S. PATENT DOCUMENTS 3,772,628 A * 11/1973 Underwood ..... G01L 9/0054 338/4
5,231,301 A * 7/1993 Peterson ..... G01L 9/0054 257/364
(Continued)

FOREIGN PATENT DOCUMENTS

JP H2-41183 9/1990
JP H6-207871 7/1994
(Continued)

OTHER PUBLICATIONS

Bhat, K.N., Nayak, M.M.; "MEMS Pressure Sensors—An Overview of Challenges in Technology and Packaging"; J. ISS vol. 2, No. 1, pp. 39-71 (Mar. 2013).
(Continued)

*Primary Examiner* — Kenneth J Whittington
(74) *Attorney, Agent, or Firm* — Renner, Otto, Boisselle & Sklar, LLP.

(57) ABSTRACT

A semiconductor pressure sensor includes n-type semiconductor regions, which are formed in a diaphragm of a semiconductor substrate, piezoresistive elements, which are respectively formed in the n-type semiconductor regions, and conductive shielding thin film layers, which are respectively formed on the piezoresistive elements through an insulating thin film layer, and the piezoresistive elements form a Wheatstone bridge circuit. Further, the n-type semiconductor regions and the conductive shielding thin film layers are electrically connected to each other through contacts formed in the diaphragm.

17 Claims, 8 Drawing Sheets

(51) Int. Cl.
*H01L 29/84* (2006.01)
*G01L 9/00* (2006.01)

(58) Field of Classification Search
USPC ..... 73/715, 721, 720, 719, 725, 726, 727, 73/754; 338/4; 257/419
See application file for complete search history.

(56) References Cited

U.S. PATENT DOCUMENTS

| | | | | |
|---|---|---|---|---|
| 5,514,898 | A * | 5/1996 | Hartauer | 257/417 |
| 5,869,876 | A * | 2/1999 | Ishio et al. | 257/419 |
| 5,949,118 | A * | 9/1999 | Sakai et al. | 257/419 |
| 6,218,717 | B1 * | 4/2001 | Toyoda et al. | 257/419 |
| 6,747,329 | B2 * | 6/2004 | Yoshihara et al. | 257/419 |
| 6,875,673 | B2 * | 4/2005 | Ishio | 438/462 |
| 7,998,777 | B1 * | 8/2011 | Gamage et al. | 438/53 |
| 2002/0003274 | A1 * | 1/2002 | Bryzek | G01L 9/0054 257/414 |
| 2004/0253760 | A1 * | 12/2004 | Zhang et al. | 438/53 |
| 2007/0052046 | A1 * | 3/2007 | Chu et al. | 257/415 |
| 2009/0302716 | A1 * | 12/2009 | Ohara et al. | 310/363 |
| 2010/0304518 | A1 * | 12/2010 | Suminto et al. | 438/51 |
| 2013/0105923 | A1 * | 5/2013 | Yu et al. | 257/419 |

FOREIGN PATENT DOCUMENTS

| | | |
|---|---|---|
| JP | H8-86671 | 4/1996 |
| JP | H10-160610 | 6/1998 |
| JP | 2008-190970 | 8/2008 |
| JP | 2010-185781 | 8/2010 |

OTHER PUBLICATIONS

International Search Report for corresponding International Application No. PCT/IB2011/003018 mailed Mar. 6, 2012.
Form PCT/ISA/237 for corresponding International Application No. PCT/IB2011/003018 dated Mar. 6, 2012.

* cited by examiner

SEMICONDUCTOR PRESSURE SENSOR

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

FIELD OF THE INVENTION

The present invention relates to a semiconductor pressure sensor for use in detecting a pressure applied to a diaphragm by using a Wheatstone bridge circuit constituted by piezoresistive elements formed on the diaphragm.

BACKGROUND OF THE INVENTION

Conventionally, there has been developed a semiconductor pressure sensor in which piezoresistive elements (strain gauge resistive elements) are respectively disposed at separate locations on a surface of a diaphragm to form a Wheatstone bridge circuit. The semiconductor pressure sensor detects deflection occurring in the diaphragm when a pressure is applied to the sensor by detecting a change in the output voltage of the Wheatstone bridge circuit due to the applied bias according to a change in the resistance of the piezoresistive elements.

In such a semiconductor pressure sensor, an offset voltage (output voltage of the Wheatstone bridge circuit when no pressure is applied to the sensor) varies when the power is supplied to the Wheatstone bridge circuit.

As a cause of the above, it is considered that movable ions that are present on the surface of the sensor are moved to the surface of the piezoresistive elements after the power is supplied, thereby changing the resistances of the piezoresistive elements. In view of the above, there has been proposed a method of suppressing the change in resistances of the piezoresistive elements due to the movable ions by providing a so-called electrical shield by forming a conductive film (shield thin film) on the surface of each of the piezoresistive elements through an insulating film and applying a predetermined potential, e.g., the lowest potential that can be applied to the Wheatstone bridge circuit, to the conductive film (see Patent Documents 1 and 2)

Patent Document 1: Japanese Patent Application Publication No. H8-86671

Patent Document 2: Japanese Patent Publication No. H2-41183

In Patent Document 1, each of the shield thin film is connected to the substrate potential via a connection film in a thick portion of the substrate, i.e., outside the diaphragm, and the shield thin films are controlled and maintained at the substrate potential to stabilize the resistances of the piezoresistive elements and suppress the drift of the output voltage.

Thus, since each of the shield thin films is connected to the substrate potential via a connection film outside the diaphragm, in order to avoid interference with the wiring for electrically connecting the piezoresistive elements, the layout area of the connection film increases. Accordingly, it leads to a problem such that the configuration of the sensor becomes large in size and the product cost increases. Further, it becomes necessary to provide the connection film for connecting the shield thin film to the substrate potential, and it is required to provide a manufacturing process for forming the connection film, thereby resulting in an increase in the number of manufacturing processes and the manufacturing cost.

In Patent Document 2, the shield thin films (shield metal film) respectively corresponding to piezoresistive elements are configured such that the shield potentials thereof can be arbitrarily chosen among the highest potential, an intermediate potential and the lowest potential of the Wheatstone bridge circuit. That is, all shield thin films are fixed to a common potential of any one of the above potentials.

However, in the piezoresistive element connected to the highest potential side of the Wheatstone bridge circuit and the piezoresistive element connected to the lowest potential side of the Wheatstone bridge circuit, a potential difference between both ends of the resistor, i.e., the voltage across the resistor itself is different. Therefore, when all shield thin films are fixed to the identical potential, a potential difference between the shield thin film and the piezoresistive element connected to the highest potential side is different from a potential difference between the shield thin film and the piezoresistive element connected to the lowest potential side. As a result, the degree of electrical influence on the piezoresistive element from the shield thin film may be different, and a variation may occur in the temperature characteristics and the resistance of the piezoresistive element, thereby deteriorating the offset voltage or offset drift.

SUMMARY OF THE INVENTION

In view of the above, the present invention provides a semiconductor pressure sensor capable of achieving miniaturization of a configuration and simplification of a manufacturing process.

Further, the present invention also provides the semiconductor pressure sensor capable of improving an offset voltage and offset drift of a Wheatstone bridge circuit composed of piezoresistive elements.

In accordance with an embodiment of the present invention, there is provided a semiconductor pressure sensor including: a semiconductor substrate; a diaphragm formed by thinning a portion of the semiconductor substrate, the diaphragm serving as a pressure receiving portion; n-type semiconductor regions formed in the diaphragm; piezoresistive elements, which are respectively formed in the n-type semiconductor regions; and conductive shielding thin film layers, which are respectively formed on the piezoresistive elements through an insulating thin film layer, the piezoresistive elements forming a Wheatstone bridge circuit. The n-type semiconductor regions and the conductive shielding thin film layers are electrically connected to each other through contacts, and the contacts are formed in the diaphragm.

In accordance with another embodiment of the present invention, there is provided a semiconductor pressure sensor including: a semiconductor substrate; a diaphragm formed by thinning a portion of the semiconductor substrate, the diaphragm serving as a pressure receiving portion; n-type semiconductor regions formed in the diaphragm; piezoresistive elements, which are respectively formed in the n-type semiconductor regions; conductive shielding thin film layers, which are respectively formed on the piezoresistive elements through an insulating thin film layer, the piezoresistive elements forming a Wheatstone bridge circuit, wherein the conductive shielding thin film layers, which are formed on the piezoresistive elements connected to a high voltage of the Wheatstone bridge circuit, are electrically connected to each other, and the conductive shielding thin film layers, which are formed on the piezoresistive elements connected to a low voltage of the Wheatstone bridge circuit, are electrically connected to each other.

In accordance with the present invention, since the n-type semiconductor region and the shielding thin film layer, which is formed on the piezoresistive element formed in the corresponding n-type semiconductor region, are electrically connected to each other in the diaphragm, it is possible to apply a predetermined potential to the shielding thin film layer through the n-type semiconductor region. Thus, a wiring for applying a predetermined potential to the shielding thin film layer is not required, and it is possible to achieve miniaturization of the configuration and simplification of the manufacturing process.

Further, in accordance with the present invention, the shielding thin film layers, which are formed on the piezoresistive elements connected to the high voltage of the Wheatstone bridge circuit, are electrically connected to each other, and the shielding thin film layers, which are formed on the piezoresistive elements connected to the low voltage of the Wheatstone bridge circuit, are electrically connected to each other. Accordingly, the shielding thin film layers, which are formed on the piezoresistive elements connected to the high voltage of the Wheatstone bridge circuit, and the shielding thin film layers, which are formed on the piezoresistive elements connected to the low voltage of the Wheatstone bridge circuit, can be fixed at different potentials. As a result, it is possible to substantially equalize the degree of electrical influence on each of the piezoresistive elements from the corresponding shielding thin film layer, and it is possible to improve the offset drift and offset voltage of the Wheatstone bridge circuit.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1A:
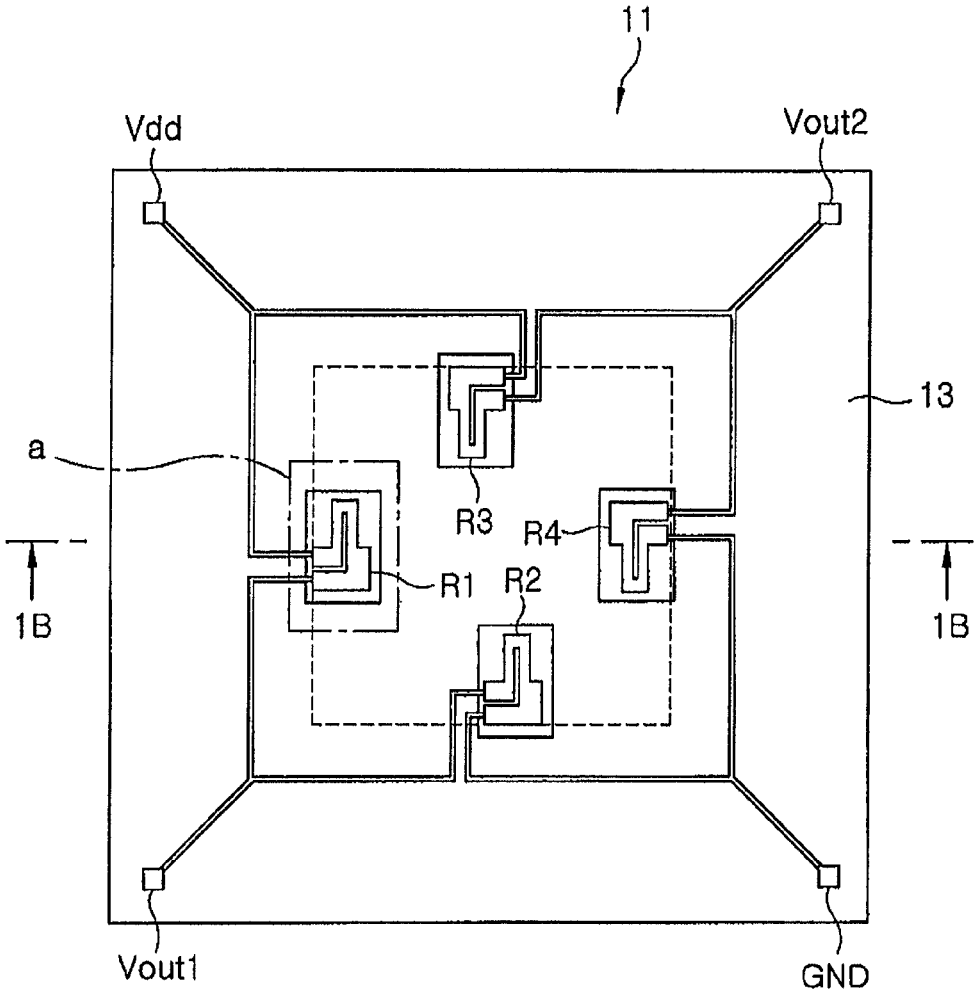
FIGS. 1A and 1B show a configuration of a semiconductor pressure sensor in accordance with a first embodiment of the present invention.

Hereinafter, embodiments of the present invention will be described in detail with reference to the accompanying drawings which form a part hereof. Throughout the specification and drawings, like reference numerals will be given to like parts having substantially the same function and configuration, and a redundant description thereof will be omitted.

First Embodiment

Figure 1B:
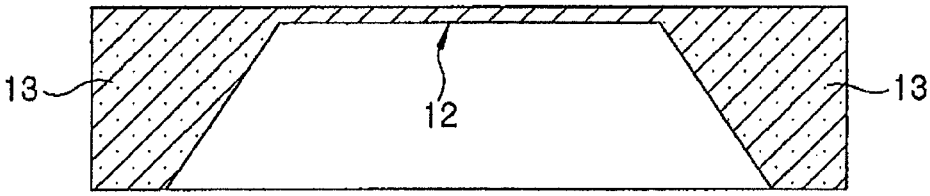

FIGS. 1A and 1B show a configuration of a semiconductor pressure sensor in accordance with a first embodiment of the present invention. FIG. 1A is a plan view of the semiconductor pressure sensor, and FIG. 1B is a cross-sectional view taken along line 1B-1B of FIG. 1A. As shown in FIGS. 1A and 1B, a semiconductor pressure sensor 11 in accordance with the first embodiment of the present invention includes a semiconductor substrate 13 which is made of, e.g., a single crystal silicon substrate and has a thin diaphragm 12 formed in a rectangular shape, and piezoresistive elements R1 to R4 which are respectively formed on a surface region of the semiconductor substrate 13 inside of four side of the diaphragm 12.

One end of the piezoresistive element R1 is connected to one end of the piezoresistive element R2 through, e.g., a diffusion wiring, and the connection node is connected to an output terminal Vout1 of a Wheatstone bridge circuit to be described below. The other end of the piezoresistive element R1 is connected to a high voltage Vdd, which serves as a bias voltage to be applied to the Wheatstone bridge circuit. The other end of the piezoresistive element R2 is connected to a ground (ground potential) GND serving as a low voltage.

One end of the piezoresistive element R3 is connected to one end of the piezoresistive element R4 through, e.g., a diffusion wiring, and the connection node is connected to an output terminal Vout2 of the Wheatstone bridge circuit to be described below. The other end of the piezoresistive element R3 is connected to the high voltage Vdd. The other end of the piezoresistive element R4 is connected to the ground GND.

Figure 2A:
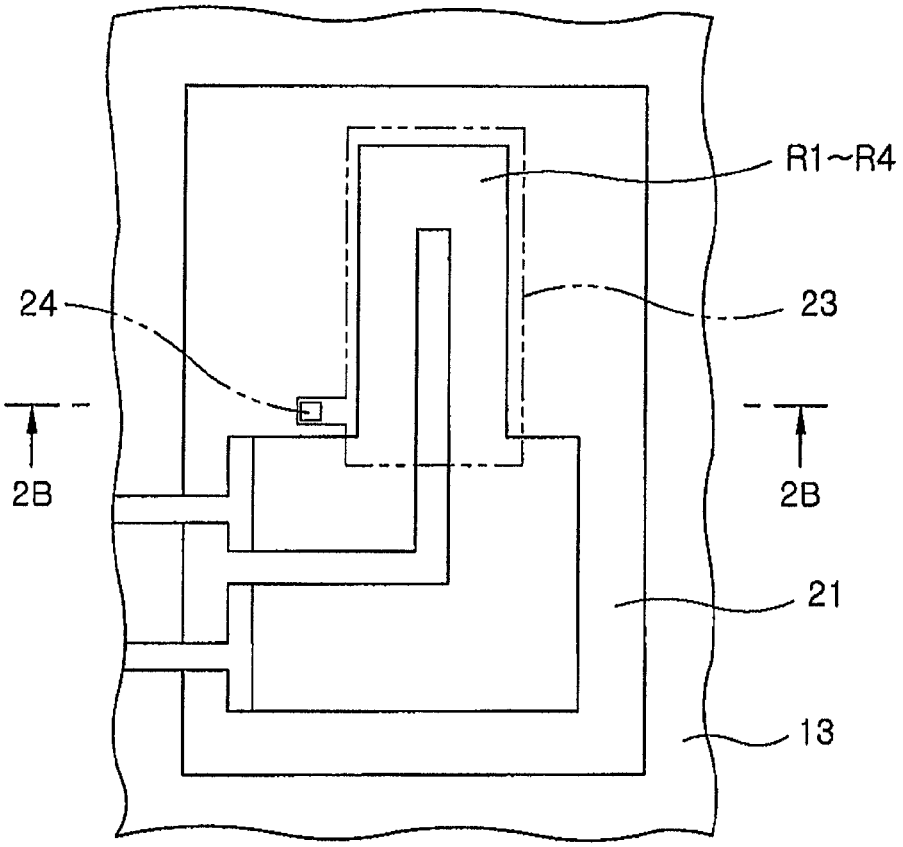
FIGS. 2A and 2B show a configuration of a portion in which the piezoresistive elements of the semiconductor pressure sensor are formed.
Figure 2B:
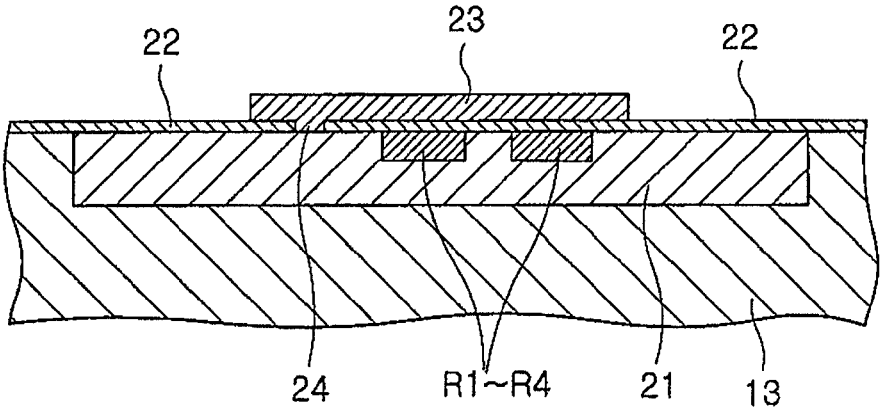

FIG. 2A is an enlarged plan view of a portion (denoted by "a" in FIG. 1A) in which each of the piezoresistive elements R1 to R4 is formed, and FIG. 2B is a cross-sectional view taken along line 2B-2B of FIG. 2A.

As shown in FIGS. 2A and 2B, n-type semiconductor regions 21, in each of which n-type impurities are selectively introduced, are independently and separately formed in the semiconductor substrate 13 within the diaphragm 12 to respectively correspond to the piezoresistive elements R1 to R4. Each of the piezoresistive elements R1 to R4 is formed in a surface portion of the corresponding n-type semiconductor region 21, for example, by selectively diffusing the impurities at a low concentration. Conductive shielding thin film layers 23 are formed separately and independently on the respective piezoresistive elements R1 to R4 through an insulating thin film layer 22 such as an oxide film. The shielding thin film layers 23, which are respectively insulated from the piezoresistive elements R1 to R4 by the insulating thin film layer 22, are electrically connected to the n-type semiconductor regions 21 located below the shielding thin film layers 23 at contacts 24, respectively. The contacts 24 electrically connecting the shielding thin film layers 23 with the n-type semiconductor regions 21 are formed in the region of the rectangular-shaped diaphragm 12.

Each of the conductive shielding thin film layers 23 is made of, e.g., polycrystalline silicon whose coefficient of linear expansion is close to that of the diaphragm 12. The shielding thin film layer 23 corresponding to each of the piezoresistive elements R1 to R4 functions as an electrical shield by independently applying thereto a predetermined potential that is set in advance, e.g., an intermediate potential outputted to the output terminals Vout1 or Vout2, or a potential of the high voltage Vdd. The potential is applied to each of the shielding thin film layers 23 through the corresponding n-type semiconductor region 21. Thus, there is no need to have a configuration in which, e.g., a dedicated wiring is provided to directly supply a predetermined potential to the shielding thin film layer 23.

Figure 3:
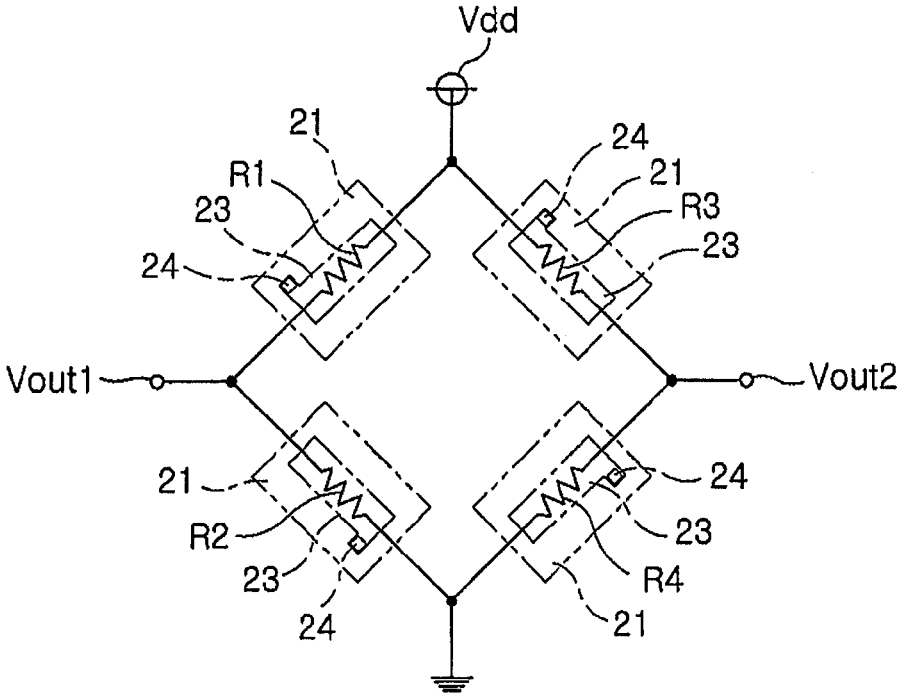
FIG. 3 shows a configuration of a Wheatstone bridge circuit composed of the piezoresistive elements.

In the semiconductor pressure sensor 11 having such a configuration, the piezoresistive elements R1 to R4 form a Wheatstone bridge circuit as shown in FIG. 3. One end of the piezoresistive element R1 is connected to the high voltage Vdd, and the other end of the piezoresistive element R1 is connected to the first output terminal Vout1 of the Wheatstone bridge circuit. One end of the piezoresistive element R2 is connected to the ground GND, and the other end of the piezoresistive element R2 is connected to the first output terminal Vout1 of the Wheatstone bridge circuit. One end of the piezoresistive element R3 is connected to the high voltage Vdd, and the other end of the piezoresistive element R3 is connected to the second output terminal Vout2 of the Wheatstone bridge circuit. One end of the piezoresistive element R4 is connected to the ground GND, and the other end of the piezoresistive element R4 is connected to the second output terminal Vout2 of the Wheatstone bridge circuit.

In the semiconductor pressure sensor 11 having such a configuration, when a pressure is applied to one surface of the diaphragm 12, deflection occurs in the diaphragm 12 due to a pressure difference between the upper and lower surfaces of the diaphragm 12. This deflection causes distortion of crystals forming the piezoresistive elements R1 to R4, thereby changing a resistance value. Then, by using the Wheatstone bridge circuit, a change in the resistance value of the piezoresistive elements R1 to R4 is detected from the first and the second output terminal Vout1 and Vout2 as a voltage change with respect to the high voltage Vdd. Thus, the pressure applied to the semiconductor pressure sensor 11 is converted into an electrical signal to be extracted, and the pressure is detected based on the extracted electrical signal.

Thus, in the first embodiment, since the conductive shielding thin film layer 23 can be fixed to a predetermined potential by the potential applied thereto via the n-type semiconductor region 21, each of the piezoresistive elements R1 to R4 can be electrically shielded to reduce offset drift.

Further, since the n-type semiconductor region 21 and the shielding thin film layer 23 are electrically connected through the contact 24, the predetermined potential can be applied to the shielding thin film layer 23 through the n-type semiconductor region 21. Therefore, there is no need to have a wiring for supplying a potential to each of the shielding thin film layers 23 or the like, and it is possible to reduce the size (configuration) of the chip, and also simplify the manufacturing process.

Further, since the contacts 24 are formed in the diaphragm 12, the n-type semiconductor regions 21 and the shielding thin film layers 23 are connected to each other within the diaphragm 12. Thus, in each of the piezoresistive elements R1 to R4, the hysteresis is reduced and the temperature characteristic is excellent, thereby obtaining an effect of being less susceptible to thermal stress.

By using polycrystalline silicon to form the shielding thin film layers 23, the hysteresis due to thermal history is less likely to occur as compared with the case of using a metal thin film such as aluminum or copper. Further, when the manufacturing process for the CMOS is used to manufacture the semiconductor pressure sensor 11, it is possible to achieve formation of the shielding thin film layers 23 by using the same process as the process of forming polycrystalline silicon used for the gate electrode of the MOSFET. Thus, it is possible to reduce the manufacturing cost and simplify the manufacturing process.

Second Embodiment

Figure 4:
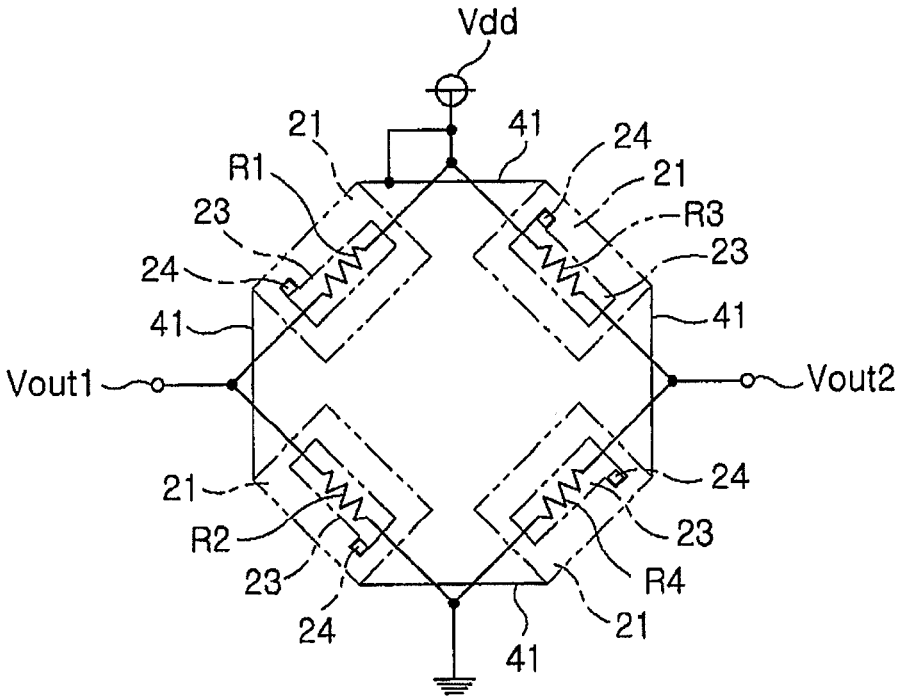
FIG. 4 shows a configuration of a Wheatstone bridge circuit in a semiconductor pressure sensor in accordance with a second embodiment of the present invention.

FIG. 4 shows a configuration of a semiconductor pressure sensor in accordance with a second embodiment of the present invention. FIG. 4 corresponds to FIG. 3 of the first embodiment. Since the configuration and arrangement of each of the piezoresistive elements R1 to R4 are the same as those in FIGS. 1A to 2B of the first embodiment, a description thereof will be omitted.

In contrast to the first embodiment, the second embodiment is characterized in that the n-type semiconductor regions 21 respectively including the piezoresistive elements R1 to R4 are connected commonly to a wiring 41 made of a diffusion layer, a metal or the like, and connected to the high voltage Vdd of the Wheatstone bridge circuit.

With such configuration, in the second embodiment, it is possible to apply a potential of the high voltage to the shielding thin film layers 23 through the respective n-type semiconductor regions 21. Thus, the potentials of the shielding thin film layers 23 can be simultaneously fixed to a constant potential of the high voltage Vdd, and therefore an electrical shielding effect for each of the piezoresistive elements R1 to R4 becomes uniform, and it is possible to increase an effect of reducing the offset drift.

Third Embodiment

Figure 5:
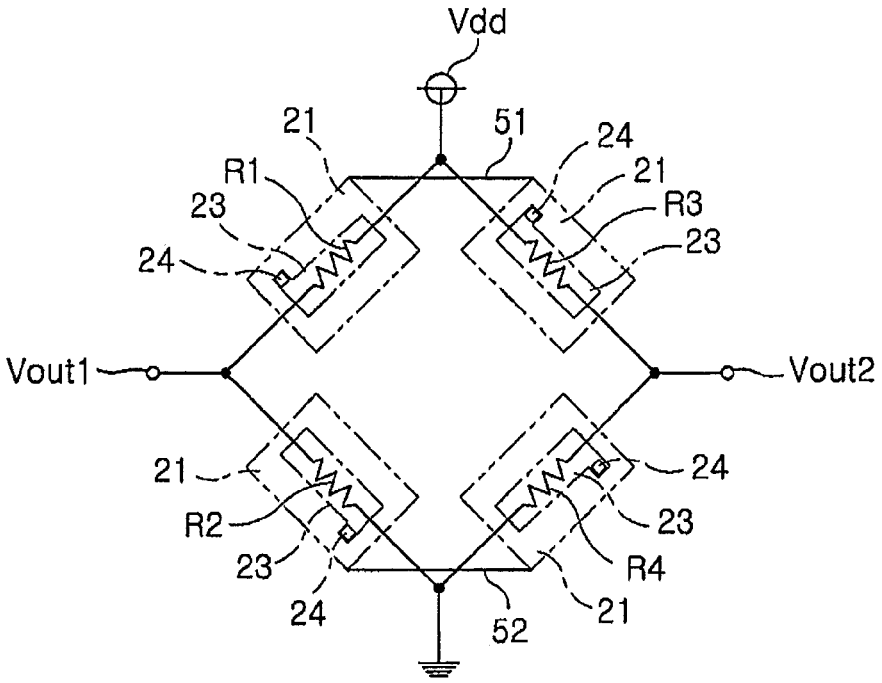
FIG. 5 shows a configuration of a Wheatstone bridge circuit in a semiconductor pressure sensor in accordance with a third embodiment of the present invention.

FIG. 5 shows a configuration of a semiconductor pressure sensor in accordance with a third embodiment of the present invention. FIG. 5 corresponds to FIG. 3 of the first embodiment. Since the configuration and arrangement of each of the piezoresistive elements R1 to R4 are the same as those in FIGS. 1A to 2B of the first embodiment, a description thereof will be omitted.

In contrast to the first embodiment, the third embodiment is characterized in that the n-type semiconductor regions 21 respectively including the piezoresistive elements R1 and R3, one end of each of which is connected to the high voltage Vdd, are connected to each other through a wiring 51 made of a diffusion layer, a metal or the like. The third embodiment is further characterized in that the n-type semiconductor regions 21 respectively including the piezoresistive elements R2 and R4, one end of each of which is connected to the ground GND, are connected to each other through a wiring 52 made of a diffusion layer, a metal or the like.

With such configuration, in the third embodiment, it is possible to apply different potentials to the n-type semiconductor regions 21 where the piezoresistive elements R1 and R3 are formed and the n-type semiconductor regions 21 where the piezoresistive elements R2 and R4 are formed. Thus, the shielding thin film layers 23 for shielding the piezoresistive elements R1 and R3 and the shielding thin film layers 23 for shielding the piezoresistive elements R2 and R4 can be maintained at different potentials. As a result, by reducing a potential difference between each of the piezoresistive elements R1 to R4 and the corresponding shielding thin film layer 23, it becomes possible to equalize the degree of electrical influence on each of the piezoresistive elements R1 to R4 from the corresponding shielding thin film layer 23, thereby reducing the offset voltage and improving the offset drift.

Fourth Embodiment

Figure 6:
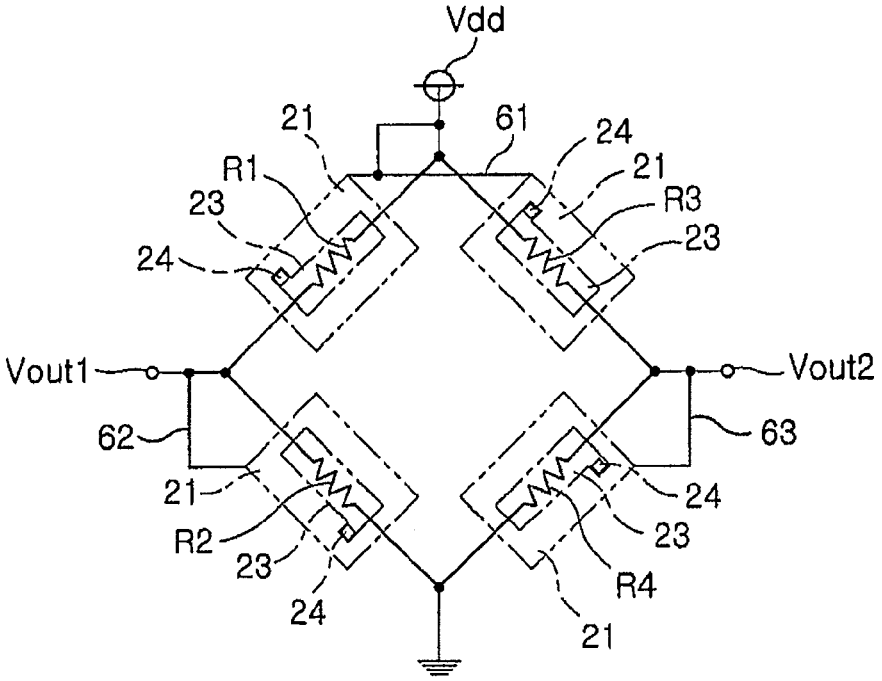
FIG. 6 shows a configuration of a Wheatstone bridge circuit in a semiconductor pressure sensor in accordance with a fourth embodiment of the present invention.

FIG. 6 shows a configuration of a semiconductor pressure sensor in accordance with a fourth embodiment of the present invention. FIG. 6 corresponds to FIG. 3 of the first embodiment. Since the configuration and arrangement of each of the piezoresistive elements R1 to R4 are the same as those in FIGS. 1A to 2B of the first embodiment, a description thereof will be omitted.

In contrast to the first embodiment, the fourth embodiment is characterized in that the n-type semiconductor regions 21 respectively including the piezoresistive elements R1 and R3, one end of each of which is connected to the high voltage Vdd, are connected to each other through a wiring 61 made of a diffusion layer, a metal or the like, and commonly connected to the high voltage Vdd of the Wheatstone bridge circuit. The fourth embodiment is further characterized in that the n-type semiconductor region 21 including the piezoresistive element R2, one end of which is connected to the ground GND, is connected to the output terminal Vout1 of the Wheatstone bridge circuit through a wiring 62 made of a diffusion layer, a metal or the like, and the n-type semiconductor region 21 including the piezoresistive element R4, one end of which is connected to the ground GND, is connected to the output terminal Vout2 of the Wheatstone bridge circuit through a wiring 63 made of a diffusion layer, a metal or the like.

With such configuration, in the fourth embodiment, it is possible to apply different potentials to the n-type semiconductor regions 21 where the piezoresistive elements R1 and R3 are formed and the n-type semiconductor regions 21 where the piezoresistive elements R2 and R4 are formed. Thus, the shielding thin film layers 23 for shielding the piezoresistive elements R1 and R3 and the shielding thin film layers 23 for shielding the piezoresistive elements R2 and R4 can be maintained at different potentials. That is, the potential of the shielding thin film layers 23 for shielding the piezoresistive elements R1 and R3 can be fixed to a potential of the high voltage Vdd, and the potential of the shielding thin film layers 23 for shielding the piezoresistive elements R2 and R4 can be fixed to an intermediate potential between the potential of the high voltage Vdd and the potential of the ground GND. As a result, by reducing a potential difference between each of the piezoresistive elements R1 to R4 and the corresponding shielding thin film layer 23, it becomes possible to equalize the degree of electrical influence on each of the piezoresistive elements R1 to R4 from the corresponding shielding thin film layer 23, thereby reducing the offset voltage and improving the offset drift.

Fifth Embodiment

Figure 7A:
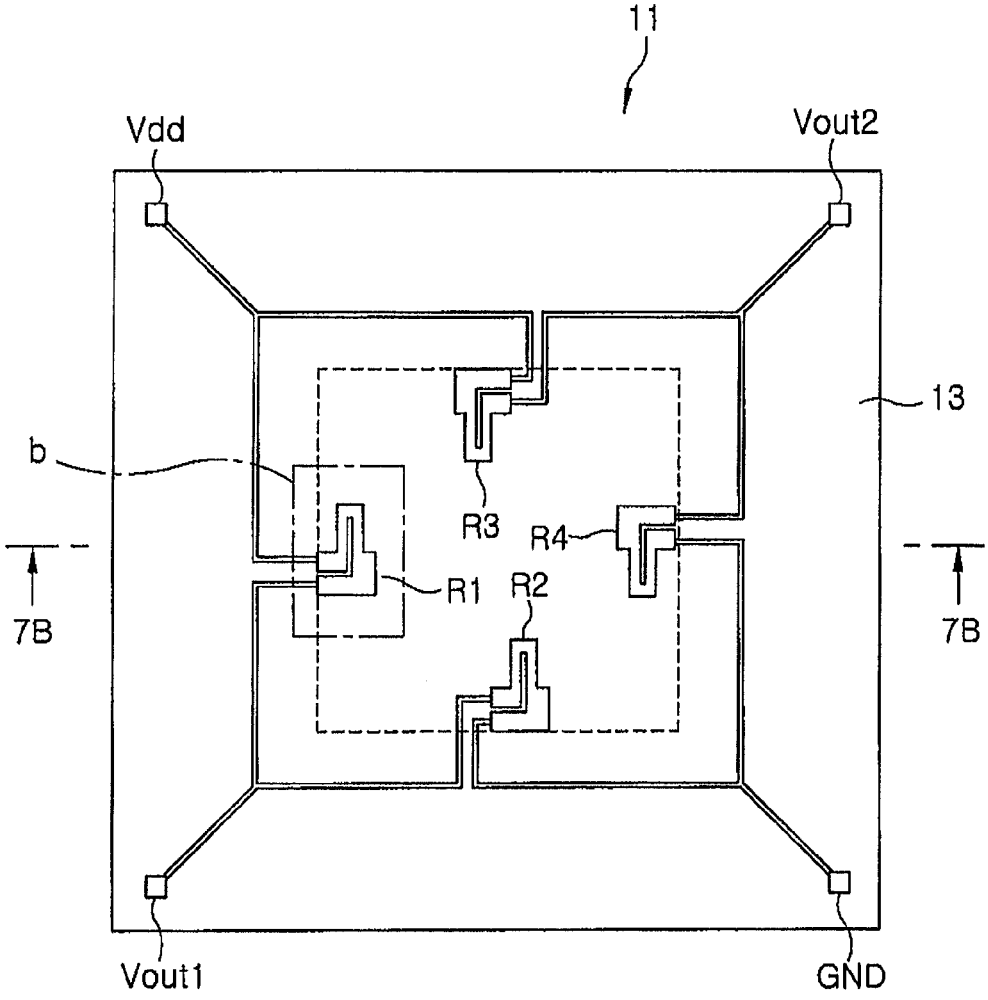
FIGS. 7A and 7B show a configuration of a Wheatstone bridge circuit in a semiconductor pressure sensor in accordance with a fifth embodiment of the present invention.
Figure 7B:
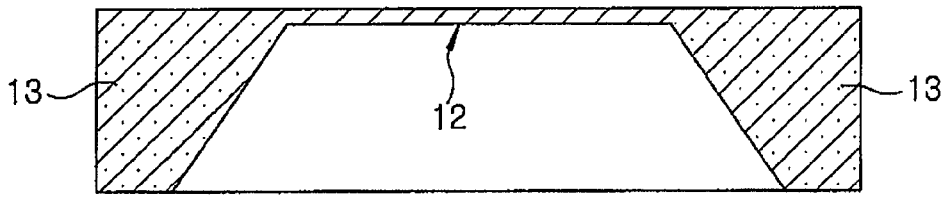

FIGS. 7A and 7B show a configuration of a semiconductor pressure sensor in accordance with a fifth embodiment of the present invention. FIG. 7A is a plan view of the semiconductor pressure sensor, and FIG. 7B is a cross-sectional view taken along line 7B-7B of FIG. 7A. As shown in FIGS. 7A and 7B, a semiconductor pressure sensor 11 in accordance with the fifth embodiment of the present invention includes a semiconductor substrate 13 which is made of, e.g., a single crystal silicon substrate and has a thin diaphragm 12 formed in a rectangular shape, and piezoresistive elements R1 to R4 which are formed on a surface region of the semiconductor substrate 13 inside of four side of the diaphragm 12.

One end of the piezoresistive element R1 is connected to one end of the piezoresistive element R2 through, e.g., a diffusion wiring, and the connection node is connected to an output terminal Vout1 of a Wheatstone bridge circuit to be described below. The other end of the piezoresistive element R1 is connected to a high voltage Vdd, which serves as a bias voltage to be applied to the Wheatstone bridge circuit. The other end of the piezoresistive element R2 is connected to a ground (ground potential) GND serving as a low voltage.

One end of the piezoresistive element R3 is connected to one end of the piezoresistive element R4 through, e.g., a diffusion wiring, and the connection node is connected to an output terminal Vout2 of the Wheatstone bridge circuit to be described below. The other end of the piezoresistive element R3 is connected to the high voltage Vdd. The other end of the piezoresistive element R4 is connected to the ground GND.

Figure 8A:
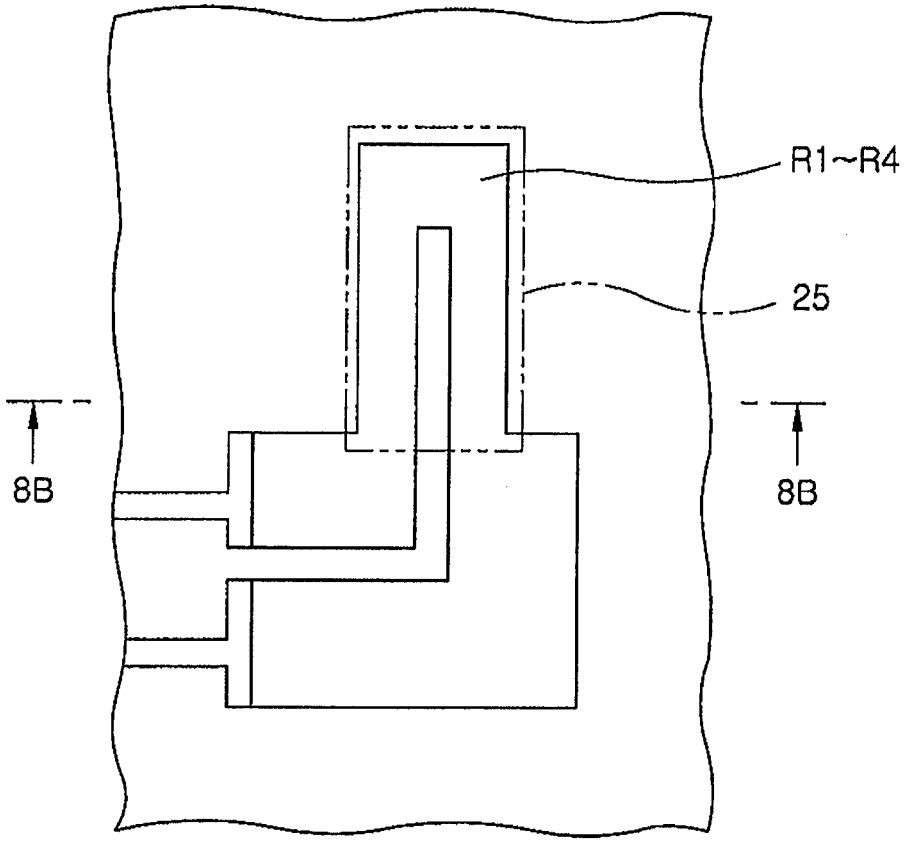
FIGS. 8A and 8B show a configuration of a portion in which the piezoresistive elements of the semiconductor pressure sensor are formed.
Figure 8B:
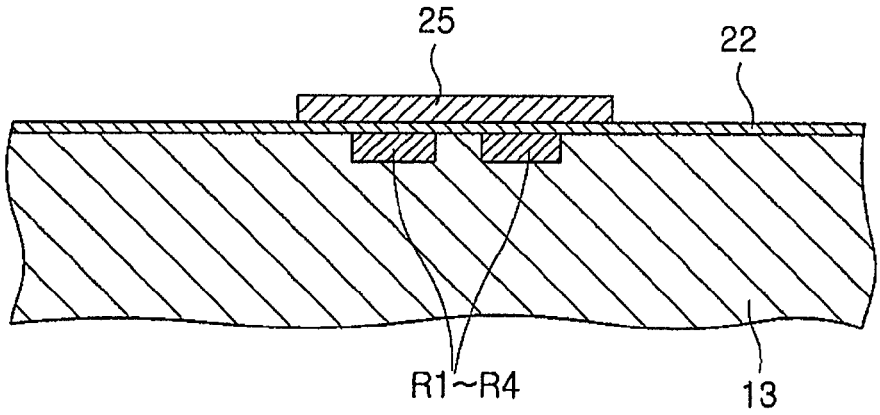

FIG. 8A is an enlarged plan view of a portion (denoted by "b" in FIG. 7A) in which each of the piezoresistive elements R1 to R4 is formed, and FIG. 8B is a cross-sectional view taken along line 8B-8B of FIG. 8A.

As shown in FIGS. 8A and 8B, each of the piezoresistive elements R1 to R4 is formed in a surface portion of the semiconductor substrate 13 within the diaphragm 12, for example, by selectively diffusing the impurities at a low concentration. Conductive shielding thin film layers 25 are formed separately and independently on the respective piezoresistive elements R1 to R4 through an insulating thin film layer 22 such as an oxide film. The shielding thin film layers 25 are respectively insulated from the piezoresistive elements R1 to R4 by the insulating thin film layer 22. Each of the conductive shielding thin film layers 25 is made of, e.g., polycrystalline silicon whose coefficient of linear expansion is close to that of the diaphragm 12.

The shielding thin film layer 25 corresponding to each of the piezoresistive elements R1 to R4 functions as an electrical shield by applying a predetermined potential that is set in advance, e.g., a potential of the high voltage Vdd or an intermediate potential between the potential of the high voltage Vdd and the potential of the ground GND.

Figure 9:
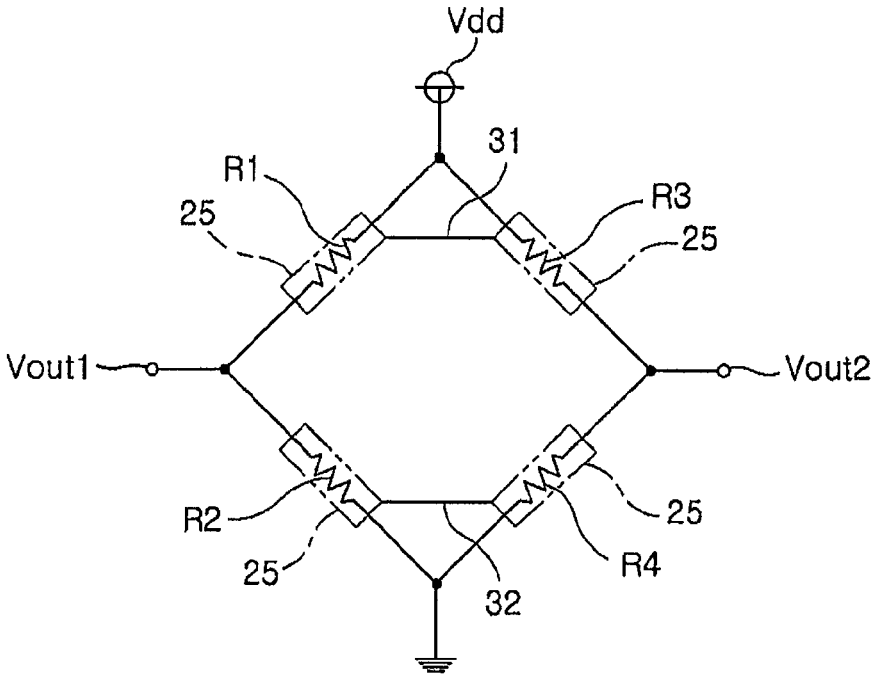
FIG. 9 shows a configuration of a Wheatstone bridge circuit composed of the piezoresistive elements.

In the semiconductor pressure sensor 11 having such a configuration, the piezoresistive elements R1 to R4 form a Wheatstone bridge circuit as shown in FIG. 9. One end of the piezoresistive element R1 is connected to the high voltage Vdd, and the other end of the piezoresistive element R1 is connected to the output terminal Vout1 of the Wheatstone bridge circuit. One end of the piezoresistive element R2 is connected to the ground GND, and the other end of the piezoresistive element R2 is connected to the output terminal Vout1 of the Wheatstone bridge circuit. One end of the piezoresistive element R3 is connected to the high voltage Vdd, and the other end of the piezoresistive element R3 is connected to the output terminal Vout2 of the Wheatstone bridge circuit. One end of the piezoresistive element R4 is connected to the ground GND, and the other end of the piezoresistive element R4 is connected to the output terminal Vout2 of the Wheatstone bridge circuit.

Further, the shielding thin film layer 25 formed on the piezoresistive element R1 and the shielding thin film layer 25 formed on the piezoresistive element R3 are electrically connected through a wiring 31 made of a diffusion layer, a metal or the like, and are configured such that the potentials of both layers can be fixed to the identical potential set in advance. The shielding thin film layer 25 formed on the piezoresistive element R2 and the shielding thin film layer 25 formed on the piezoresistive element R4 are electrically connected through a wiring 32 made of a diffusion layer, a metal or the like, and are configured such that the potentials of both layers can be fixed to the identical potential set in advance. Therefore, it is configured such that the potential applied to the shielding thin film layers 25, which are formed on the piezoresistive elements R1 and R3 connected to the high voltage Vdd, and the potential applied to the shielding thin film layers 25, which are formed on the piezoresistive elements R2 and R4 connected to the ground GND, can be set to different potentials. Further, the potential applied to each of the shielding thin film layers 25 may be determined by experiments or the like using practical equipment so as to substantially equalize the degree of electrical influence on each of the piezoresistive elements R1 to R4.

In the semiconductor pressure sensor 11 having such a configuration, when a pressure is applied to one surface of the diaphragm 12, deflection occurs in the diaphragm 12 due to a pressure difference between the upper and lower surfaces of the diaphragm 12. This deflection causes distortion of crystals forming the piezoresistive elements R1 to R4, thereby changing a resistance value. Then, by using the Wheatstone bridge circuit, a change in the resistance value of the piezoresistive elements R1 to R4 is detected from the output terminals Vout1 and Vout2 as a voltage change with respect to the high voltage Vdd. Thus, the pressure applied to the semiconductor pressure sensor 11 is converted into an electrical signal to be extracted, and the pressure is detected based on the extracted electrical signal.

Thus, in the fifth embodiment, the potential applied to the shielding thin film layers 25, which are formed on the piezoresistive elements R1 and R3 connected to the high voltage Vdd, and the potential applied to the shielding thin film layers 25, which are formed on the piezoresistive elements R2 and R4 connected to the ground GND, can be set to different potentials. Accordingly, it is possible to appropriately set the potential of each of the shielding thin film layers 25, and it is possible to substantially equalize the degree of electrical influence on each of the piezoresistive elements R1 to R4 from the corresponding shielding thin film layer 25. As a result, it is possible to improve the offset drift and offset voltage of the Wheatstone bridge circuit.

Further, when the manufacturing process for the CMOS is used to manufacture the semiconductor pressure sensor 11, it is possible to achieve formation of the shielding thin film layers 25 by using the same process as the process of forming polycrystalline silicon used for the gate electrode of the MOSFET. Thus, it is possible to reduce the manufacturing cost and simplify the manufacturing process.

Sixth Embodiment

Figure 10:
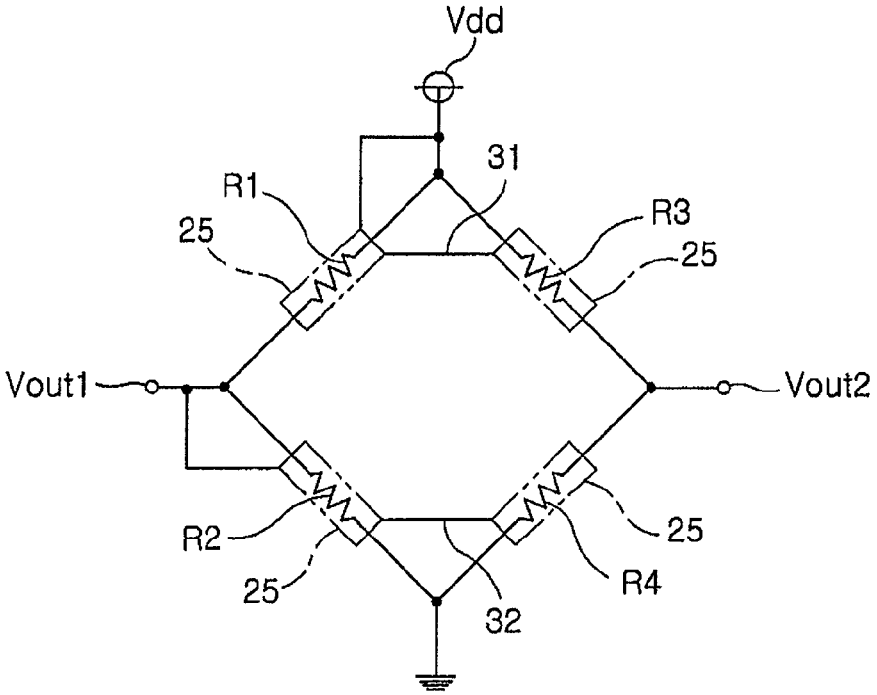
FIG. 10 shows a configuration of a Wheatstone bridge circuit in a semiconductor pressure sensor in accordance with a sixth embodiment of the present invention.

FIG. 10 shows a configuration of a semiconductor pressure sensor in accordance with a sixth embodiment of the present invention. FIG. 10 corresponds to FIG. 9 of the fifth embodiment. Since the configuration and arrangement of each of the piezoresistive elements R1 to R4 are the same as those in FIGS. 7A to 8B of the fifth embodiment, a description thereof will be omitted.

In contrast to the fifth embodiment, the sixth embodiment is characterized in that the shielding thin film layers 25, which are formed on the piezoresistive elements R1 and R3 connected to the high voltage Vdd, are connected commonly to the high voltage Vdd, and the shielding thin film layers 25, which are formed on the piezoresistive elements R2 and R4 connected to the ground GND, are connected commonly to the output terminal Vout1.

With such configuration, in the sixth embodiment, the potentials of the shielding thin film layers 25, which are formed on the piezoresistive elements R1 and R3 connected to the high voltage Vdd, can be fixed to the identical potential by applying a potential of the high voltage thereto. Further, the potential outputted to the output terminal Vout1, i.e., an intermediate potential between the potential of the high voltage Vdd and the potential of the ground GND, is applied to the shielding thin film layers 25, which are formed on the piezoresistive elements R2 and R4 connected to the ground GND, so that the potentials of both layers can be fixed to the identical potential. Accordingly, it is possible to substantially equalize the degree of electrical influence on each of the piezoresistive elements R1 to R4 from the corresponding shielding thin film layer 25. As a result, it becomes possible to improve the offset drift and offset voltage of the Wheatstone bridge circuit.

Seventh Embodiment

Figure 11:
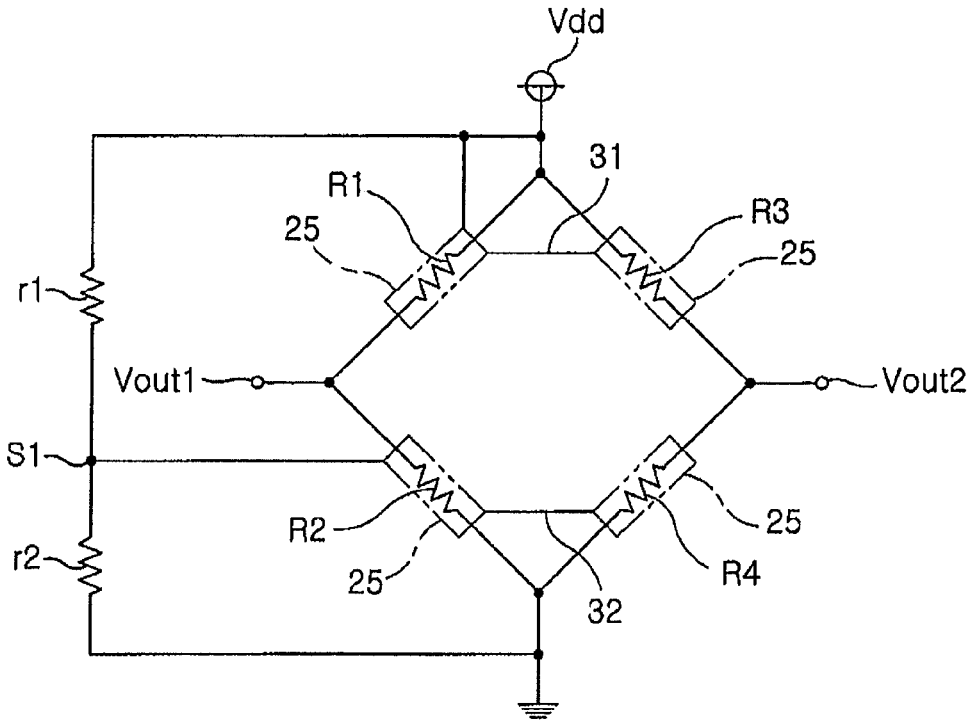
FIG. 11 shows a configuration of a Wheatstone bridge circuit in a semiconductor pressure sensor in accordance with a seventh embodiment of the present invention.

FIG. 11 shows a configuration of a semiconductor pressure sensor in accordance with a seventh embodiment of the present invention. FIG. 11 corresponds to FIG. 9 of the fifth embodiment. Since the configuration and arrangement of each of the piezoresistive elements R1 to R4 are the same as those in FIGS. 7A to 8B of the fifth embodiment, a description thereof will be omitted.

In contrast to the sixth embodiment, the seventh embodiment is characterized in that, instead of an intermediate potential obtained at the output terminal Vout1, an intermediate potential obtained at a node between resistors r1 and r2 is applied to each of the shielding thin film layers 25, which are formed on the piezoresistive elements R2 and R4 connected to the ground GND. Further, each of the shielding thin film layers 25, which are formed on the piezoresistive elements R1 and R3 connected to the high voltage Vdd, is connected to the high voltage Vdd similarly to the sixth embodiment, and a potential of the high voltage is applied thereto.

The resistors r1 and r2 are connected in series between the high voltage Vdd and the ground GND, and a series connection node S1 thereof is connected to the shielding thin film layers 25, which are formed on the piezoresistive elements R2 and R4 connected to the ground GND. The resistance values of the resistors r1 and r2 are set independently and separately, and the potential obtained at the series connection node S1 is set as an arbitrary intermediate potential between the potential of the high voltage Vdd and the potential of the ground GND. The intermediate potential may be determined by experiments or the like using practical equipment so as to substantially equalize the degree of electrical influence on each of the piezoresistive elements R1 to R4.

With such configuration, in the seventh embodiment, the potentials of the shielding thin film layers 25, which are formed on the piezoresistive elements R1 and R3 connected to the high voltage Vdd, can be fixed to the identical potential by applying a potential of the high voltage thereto. Further, an intermediate potential between the potential of the high voltage Vdd and the potential of the ground GND is applied to the shielding thin film layers 25, which are formed on the piezoresistive elements R2 and R4 connected to the ground GND, so that the potentials of both layers can be fixed to the identical potential. Accordingly, it is possible to substantially equalize the degree of electrical influence on each of the piezoresistive elements R1 to R4 from the corresponding shielding thin film layer 25. As a result, it is possible to improve the offset drift and offset voltage of the Wheatstone bridge circuit.

While the invention has been shown and described with respect to the embodiments, it will be understood by those skilled in the art that various changes and modification may be made without departing from the scope of the invention as defined in the following claims.

What is claimed is:

1. A semiconductor pressure sensor comprising:

a semiconductor substrate;

a diaphragm formed by thinning a portion of the semiconductor substrate, the diaphragm serving as a pressure receiving portion; *and*

[n-type semiconductor regions formed in the diaphragm; piezoresistive elements] *a first, a second, a third, and a fourth detecting portions*, which are respectively formed in the [n-type semiconductor regions] *diaphragm*; [and conductive shielding thin film layers, which are respectively formed on the piezoresistive elements through an insulating thin film layer, the piezoresistive elements forming a Wheatstone bridge circuit, wherein the n-type semiconductor regions and the conductive shielding thin film layers are electrically connected to each other through contacts, and the contacts are formed in the diaphragm]

*wherein each of the first, the second, the third, and the fourth detecting portions includes*

*a first end,*

*a second end,*

*a first rectangular portion having a side extending from the first end,*

*a second rectangular portion having a side extending perpendicularly from the side of the first rectangular portion,*

*a third rectangular portion having a side extending from and parallel to the side of the second rectangular portion,*

*a fourth rectangular portion having a side extending perpendicularly from the side of the third rectangular portion to be parallel with the side of the first rectangular portion,*

*a fifth rectangular portion having a side extending perpendicularly from the side of the fourth rectangular portion to be parallel with the side of the third rectangular portion, and*

*a sixth rectangular portion having a side extending perpendicularly from the side of the fifth rectangular portion to the second end to be parallel with the side of the first rectangular portion,*

*wherein, when seen in a direction normal to a main surface of the semiconductor substrate, the diaphragm has a rectangular shape having a first, a second, a third, and a fourth side,*

*wherein the side of the first rectangular portion and the side of the sixth rectangular portion of the first detecting portion each extends perpendicular to the first side,*

*wherein the first side and the third side are parallel to each other,*

*wherein the second side and the fourth side are parallel to each other,*

*wherein the second detecting portion is provided adjacent to the second side,*

*wherein the fourth detecting portion is provided adjacent to the fourth side,*

*wherein the fourth rectangular portion of the second detecting portion has an offset to the fourth rectangular portion of the fourth detecting portion in an extending direction of the side of the fourth rectangular portion of the second detecting portion.*

2. The semiconductor pressure sensor of claim 1, *further comprising conductive shielding thin film layers, which are respectively formed on the detecting portions through an insulating film layer,* wherein the conductive shielding thin film layers are made of polycrystalline silicon.

3. The semiconductor pressure sensor of claim 1, *further comprising n-type semiconductor regions formed in the diaphragm, the detecting portions being respectively formed in the n-type semiconductor regions,*

*wherein the detecting portions form a Wheatstone bridge circuit, and* wherein each of the n-type semiconductor regions is connected to a high voltage of the Wheatstone bridge circuit.

4. The semiconductor pressure sensor of claim 1, *further comprising n-type semiconductor regions formed in the diaphragm, the detecting portions being respectively formed in the n-type semiconductor regions,*

*wherein the detecting portions form a Wheatstone bridge circuit,* wherein *two of* the n-type semiconductor regions [including the piezoresistive elements] *respectively having therein two of the detecting portions*, one end of each of which is connected to a high voltage of the Wheatstone bridge circuit, are electrically connected to each other, and wherein *the remaining two of* the n-type semiconductor regions [including the piezoresistive elements] *respectively having therein the remaining two of the detecting portions*, one end of each of which is connected to a low voltage of the Wheatstone bridge circuit, are electrically connected to each other.

5. The semiconductor pressure sensor of claim 1, *further comprising n-type semiconductor regions formed in the diaphragm, the detecting portions being respectively formed in the n-type semiconductor regions,*

*wherein the detecting portions form a Wheatstone bridge circuit,* wherein *two of* the n-type semiconductor regions [including the piezoresistive elements] *respectively having therein two of the detecting portions*, one end of each of which is connected to a high voltage of the Wheatstone bridge circuit, are connected commonly to the high voltage of the Wheatstone bridge circuit, wherein [an] *one of the* n-type semiconductor [region including a first piezoresistive element] *regions having therein a first detecting portion*, one end of which is connected to a low voltage of the Wheatstone bridge circuit, is connected to a first output terminal of the Wheatstone bridge circuit which is connected to the other end of the first [piezoresistive element] *detecting portion*, and wherein [an] *the remaining one of the* n-type semiconductor region [including] *having therein* a second [piezoresistive element] *detecting portion*, one end of which is connected to the low voltage of the Wheatstone bridge circuit, is connected to a second output terminal of the Wheatstone bridge circuit which is connected to the other end of the second [piezoresistive element] *detecting portion*.

6. A semiconductor pressure sensor comprising:

a semiconductor substrate;

a diaphragm formed by thinning a portion of the semiconductor substrate, the diaphragm serving as a pressure receiving portion;

n-type semiconductor regions formed in the diaphragm;

piezoresistive elements, which are respectively formed in the n-type semiconductor regions;

conductive shielding thin film layers, which are respectively formed on the piezoresistive elements through an insulating thin film layer, the piezoresistive elements forming a Wheatstone bridge circuit, wherein the conductive shielding thin film layers, which are formed on the piezoresistive elements connected to a high voltage of the Wheatstone bridge circuit, are electrically connected to each other, and the conductive shielding thin film layers, which are formed on the piezoresistive elements connected to a low voltage of the Wheatstone bridge circuit, are electrically connected to each other.

7. The semiconductor pressure sensor of claim 6, wherein the conductive shielding thin film layers, which are formed on the piezoresistive elements connected to the high voltage of the Wheatstone bridge, are connected to the high voltage of the Wheatstone bridge circuit, and wherein an intermediate potential between a potential of the high voltage of the Wheatstone bridge circuit and a potential of the low voltage of the Wheatstone bridge circuit is applied to the conductive shielding thin film layers, which are formed on the piezoresistive elements connected to the low voltage of the Wheatstone bridge circuit.

8. The semiconductor pressure sensor of claim 7, wherein the intermediate potential is a potential obtained at an output terminal of one end of the Wheatstone bridge circuit.

9. The semiconductor pressure sensor of claim 7, wherein the intermediate potential is a potential obtained at a series connection node of resistors connected in series between the high voltage of the Wheatstone bridge circuit and the low voltage of the Wheatstone bridge circuit.

10. The semiconductor pressure sensor of claim 2, *further comprising n-type semiconductor regions formed in the diaphragm, the detecting portions being respectively formed in the n-type semiconductor regions,*

*wherein the detecting portions form a Wheatstone bridge circuit, and* wherein each of the n-type semiconductor regions is connected to a high voltage of the Wheatstone bridge circuit.

11. The semiconductor pressure sensor of claim 2, *further comprising n-type semiconductor regions formed in the diaphragm, the detecting portions being respectively formed in the n-type semiconductor regions,*

*wherein the detecting portions form a Wheatstone bridge circuit,* wherein *two of* the n-type semiconductor regions [including the piezoresistive elements] *respectively having therein two of the detecting portions*, one end of each of which is connected to a high voltage of the Wheatstone bridge circuit, are electrically connected to each other, and wherein *the remaining two of* the n-type semiconductor regions [including the piezoresistive elements] *respectively having therein the remaining two of the detecting portions*, one end of each of which is connected to a low voltage of the Wheatstone bridge circuit, are electrically connected to each other.

12. The semiconductor pressure sensor of claim 2, *further comprising n-type semiconductor regions formed in the diaphragm, the detecting portions being respectively formed in the n-type semiconductor regions,*

*wherein the detecting portions form a Wheatstone bridge circuit,* wherein *two of* the n-type semiconductor regions [including the piezoresistive elements] *respectively having therein two of the detecting portions*, one end of each of which is connected to a high voltage of the Wheatstone bridge circuit, are connected commonly to the high voltage of the Wheatstone bridge circuit, wherein [an] *one of the* n-type semiconductor [region including a first piezoresistive element] *regions having therein a first detecting portion*, one end of which is connected to a low voltage of the Wheatstone bridge circuit, is connected to a first output terminal of the Wheatstone bridge circuit which is connected to the other end of the first [piezoresistive element] *detecting portion*, and wherein [an] *the remaining one of the* n-type semiconductor region [including] *having therein* a second [piezoresistive element] *detecting portion*, one end of which is connected to the low voltage of the Wheatstone bridge circuit, is connected to a second output terminal of the Wheatstone bridge circuit which is connected to the other end of the second [piezoresistive element] *detecting portion*.

*13. The semiconductor pressure sensor of claim 1, wherein, when seen in the direction normal to the main surface of the semiconductor substrate, the second rectangular portion has a portion wider than the fifth rectangular portion, and the wider portion is connected to the first rectangular portion.*

*14. The semiconductor pressure sensor of claim 1, further comprising:*

*a first wiring which connects the first end of the first detecting portion and the second end of the second detecting portion,*

*a second wiring which connects the first end of the second detecting portion and the second end of the third detecting portion,*

*a third wiring which connects the first end of the third detecting portion and the second end of the fourth detecting portion, and*

*a fourth wiring which connects the first end of the fourth detecting portion and the second end of the first detecting portion,*

*wherein the first wiring has a portion parallel to the first side and a portion parallel to the second side,*

*wherein the second wiring has a portion parallel to the second side and a portion parallel to the third side,*

*wherein the third wiring has a portion parallel to the third side and a portion parallel to the fourth side, and*

*wherein the fourth wiring has a portion parallel to said fourth side and a portion parallel portion to the first side.*

*15. The semiconductor pressure sensor of claim 1, wherein the first, the second, the third, and the fourth detecting portion are piezoresistive.*

*16. The semiconductor pressure sensor of claim 1, wherein the first, the second, the third, and the fourth detecting portion form a Wheatstone bridge circuit.*

*17. The semiconductor pressure sensor of claim 1,*

*wherein the first detecting portion is provided adjacent to the first side,*

*wherein the side of the first rectangular portion and the side of sixth rectangular portion of the second detecting portion extend parallel to the second side,*

*wherein the third detecting portion is provided adjacent to the third side,*

*wherein the side the first rectangular portion and the side of sixth rectangular portion of the third detecting portion extend perpendicular to the third side, and*

*wherein the side of the first rectangular portion and the side of the sixth rectangular portion of the fourth detecting portion extend parallel to the fourth side.*

* * * * *